US006337219B1

United States Patent
Nishikawa

(10) Patent No.: US 6,337,219 B1
(45) Date of Patent: Jan. 8, 2002

(54) METHOD OF PRODUCING SILICON SINGLE AND SINGLE CRYSTAL SILICON WAFER

(75) Inventor: Hideshi Nishikawa, Saga (JP)

(73) Assignee: Sumitomo Metal Industries, Ltd., Osaka (JP)

( * ) Notice: Subject to any disclaimer, the term of this patent is extended or adjusted under 35 U.S.C. 154(b) by 0 days.

(21) Appl. No.: 09/381,685

(22) PCT Filed: Feb. 2, 1999

(86) PCT No.: PCT/JP99/00431

§ 371 Date: Dec. 20, 1999

§ 102(e) Date: Dec. 20, 1999

(87) PCT Pub. No.: WO99/40243

PCT Pub. Date: Aug. 12, 1999

(30) Foreign Application Priority Data

Feb. 4, 1998 (JP) .......................................... 10-023676
Nov. 13, 1998 (JP) .......................................... 10-323554

(51) Int. Cl.$^7$ .......................... G01R 31/26; H01L 21/44
(52) U.S. Cl. ........................... 438/14; 117/14; 438/660
(58) Field of Search ................................ 438/660, 661, 438/14, 15, 113; 117/14, 15, 20, 201, 202, 13

(56) References Cited

U.S. PATENT DOCUMENTS 6,056,819 A * 5/2000 Ogawa et al. ................. 117/14
6,153,009 A * 11/2000 Uesugi et al. ................. 117/20

* cited by examiner

Primary Examiner—Matthew Smith
Assistant Examiner—Calvin Lee
(74) Attorney, Agent, or Firm—Kanesaka & Takeuchi

(57) ABSTRACT

A method of manufacturing a silicon single crystal to be grown by the Czochralski method, wherein a crystal is pulled up in a CZ furnace by changing an average pulling rate for a crystal, having a predetermined length, a plurality of times, a relation between the average pulling rate and the OSF ring diameter for each pulling length is examined, an average pulling rate pattern for generation or disappearance of an OSF ring at a predetermined position is designed based on the examined results, and the single crystal is grown according to the average pulling rate pattern, and a silicon wafer not having grown-in defects is manufactured.

5 Claims, 10 Drawing Sheets

2. Grown-in defect (COP) area
1. OSF ring area
4. Oxygen precipitation area
3. Oxygen precipitation suppressing area
5. Grown-in defect (dislocation cluster) area (a)          (b)

2. Grown-in defect (COP) area

1. OSF ring area

4. Oxygen precipitation area

3. Oxygen precipitation suppressing area

5. Grown-in defect (dislocation cluster) area

METHOD OF PRODUCING SILICON SINGLE AND SINGLE CRYSTAL SILICON WAFER

TECHNICAL FIELD

The present invention relates to a method of manufacturing a silicon single crystal to be used as a semiconductor device and a silicon wafer manufactured from the grown silicon single crystal.

BACKGROUND ART

A silicon single crystal used as a semiconductor highly integrated circuit material is mainly manufactured by the Czochralski method (hereafter referred to as the CZ method)

When the silicon single crystal is grown by the CZ method, it is known that when the single crystal is processed to a wafer and then thermally treated at a high temperature, a ring-shaped oxidation induced stacking fault, which is called an OSF ring, is caused.

When the OSF ring is caused in the single crystal, there is about $10^5$ to $10^6$ $cm^{-3}$ of a grown-in defect, which is related to a point defect (vacancy) degrading the gate oxide integrity (GOI) characteristics of a MOS-type device, on the inside area of the OSF ring. This grown-in defect seems to have a hollow in it and has an octahedron base structure.

The quality of the silicon single crystal can be controlled by adjusting the positions of such areas.

For example, (1) when the OSF ring is made to disappear on the outermost periphery of the crystal, a crystal which contains no OSF ring and no grown-in defects (dislocation cluster) due to an interstitial silicon can be obtained; (2) when the OSF ring is generated between the center and the outermost periphery of the crystal, and the pulling rate and oxygen concentration of the crystal are adjusted, a crystal having extremely reduced size of OSF nuclei and a wide grown-in defect-free area formed on the ring and its outside area can be obtained; and (3) when the OSF ring is made disappear at the center, a crystal completely free from the grown-in defect on its entire surface can be obtained.

Here, the OSF ring includes a generally observable OSF ring and a latent OSF ring which has a very small OSF nuclei and cannot be seen without using special means.

It is known that the position where the OSF ring is formed is determined by the V/G value calculated from the temperature gradient G from the melting point to 1300° C. in the silicon single crystal pulled and a pulling rate V. It is recognized that a crystal having the OSF ring at a predetermined position can be obtained by keeping the V/G value at a predetermined value while pulling the crystal.

For example, the invention described in Japanese Patent Laid-Open Publication No. Hei 8-330316 discloses a method which calculates a temperature distribution in a furnace by heat transfer calculations in view of a hot zone structure of a CZ furnace, calculates the G value from the temperature distribution in a direction of a crystal length, and determines the pulling rate V according to a pulling length according to the G distribution.

The invention described in Japanese Patent Laid-Open Publication No. Hei 8-268794 measures the temperature distribution at a predetermined position in the crystal by a radiation thermometer or measures the temperature distribution near the surface of the crystal by thermocouples, and makes heat transfer calculation of a temperature gradient G within the crystal or calculates it on-line from a regression formula obtained by experiments. And, there is described a method of controlling the pulling rate V so that the V/G value becomes constant according to the G value.

Thus, it is made possible to produce or disappear the OSF ring at a target position by controlling the V/G value.

Also, supersaturated oxygen is contained in the silicon single crystal produced by the CZ method. When heat treatment is performed in a device forming process after processing the single crystal into wafers, a heat-treatment originated fine defect (oxygen precipitate) is formed due to the supersaturated oxygen contained in the single crystal.

When the oxygen precipitates are present in the device active region of the wafer surface layer, a junction leakage current characteristic is degraded.

On the other hand, when the oxygen precipitates are present in the wafer, it is effective to remove contaminants mingled during the device forming process from the device active region. In other words, an intrinsic gettering layer (called IG layer) is formed.

In order to effectively use the oxygen precipitates formed by the supersaturated oxygen contained in the crystal grown by the CZ method, the wafer formed from the silicon single crystal is subjected to a high-temperature heat treatment at a temperature about 1150° C. to out diffuse oxygen in the wafer surface zone, so that the oxygen concentration in the wafer surface layer is lowered, and a denuded zone (DZ) where an oxygen precipitate or a defect caused is not present, is formed on the wafer surface. Then, the heat treatment is further performed at a temperature between 500° C. to 900° C. to form an oxygen precipitation nucleus within the wafer in order to form an IG layer (hereafter this method is called the DZ-IG treating method).

By performing the aforesaid treatment, a high-quality wafer can be produced in which the device active region on the wafer surface layer is free from defects, while an absorbing layer for removing a contaminant from the device active region is present within the wafer.

The aforesaid method of adjusting the OSF ring forming position has the following problems.

Specifically, the invention described in Japanese Patent Laid-Open Publication No. Hei 8-330316 is the method which calculates G from the hot zone structure of the CZ furnace and determines V in order to have a predetermined V/G value and has disadvantages (a) the accuracy of the heat transfer calculation is poor, and (b) it takes time to calculate. Though the hot zone is worn and degraded with the number of pulling times, a change of G involved in such wearing and degradation is hardly taken into account. It was difficult to accurately control the V/G value because of these problems.

The invention described in Japanese Patent Laid-Open Publication No. Hei 8-268794 is the method which measures a temperature gradient of the crystal surface through online by a radiation thermometer or thermocouples and controls V according to the G value calculated from the measured value to keep the V/G value at a constant level. This method has problems, such as; (a) when the radiation thermometer is used to measure the light reflected from the surface of a melt, the inner wall of a chamber and the surface of the crystal is penetrated with stray light, and the crystal surface temperature cannot be measured accurately; (b) when a thermocouple is used to measure the crystal surface temperature, the thermocouple is influenced by heat radiation from the melt or a heater even if it is mounted near the surface of the crystal, therefore the crystal surface temperature cannot be measured accurately. Besides this, even if the temperature is measured by the aforesaid methods, the measured temperature is a temperature of the crystal surface and not a measured value of the actual temperature within the crystal having the OSF ring formed therein. The temperature inside the crystal is merely estimated from the surface temperature, therefore it is difficult to control the OSF ring diameter with high precision.

Thus, it is not easy to correctly know the G value which is the temperature gradient within the single crystal at the time of being pulled.

The DZ treating method which is used as a treating method for forming the aforesaid high-quality wafer has the following disadvantages.

The DZ treating method out-diffuses the supersaturated oxygen present on the wafer surface zone by the high-temperature heat treatment and decreases undetected oxygen precipitates present on the wafer surface layer or secondary defects induced by the oxygen precipitates by selective etching used for evaluation.

However, the aforesaid DZ-IG treating method cannot eliminate the grown-in defects formed at crystal pulling.

Specifically, the oxygen precipitates are eliminated from the wafer surface layer by the treatment of out diffusion of oxygen, but the grown-in defects formed during the crystal growth are still present, and a real defect-free layer is not formed.

Therefore, the present invention provides a method for manufacturing a silicon single crystal with an OSF ring located at a desired position by designing a predetermined pulling rate pattern in view of a relation between an OSF ring diameter and a crystal pulling rate for each crystal pulling length in order to control the OSF ring diameter without measuring the actual temperature gradient G within the single crystal. However, it is an object of the invention to provide a high-quality single crystalline silicon wafer, which is free from defects such as grown-in defects in a device active region and has an intrinsic gettering effect, by using a silicon single crystal having an OSF ring formed at a desired position.

DISCLOSURE OF THE INVENTION

The invention described in claim 1 relates to a method of manufacturing a silicon single crystal grown by the Czochralski method, the method is characterized in that a crystal is pulled up in a CZ furnace by changing an average pulling rate for the crystal having a predetermined length more than two times; a relation between a crystal pulling length, an average pulling rate and an OSF ring diameter is measured; an average pulling rate pattern at each pulling rate of the crystal for generation or disappearance of an OSF ring at a predetermined position is designed based on the measured results; and the crystal is pulled according to the average pulling rate pattern.

The present invention relates to a method of manufacturing a silicon single crystal, to obtain the crystal of predetermined OSF ring diameter, according to the relation of OSF ring diameter and average pulling rate at each pulling length, without measuring a G value.

A pulling rate V does not indicate an instantaneous pulling rate but means an average value of pulling rate measured for 10 minutes or more. Changes of the instantaneous pulling rate do not affect the OSF ring diameter in the crystal, but changes of the average pulling rate over 10 minutes or more affect the OSF ring diameter in the crystal. Therefore, the term "average pulling rate" is used in the present invention.

A temperature gradient at any part of the crystal is determined from (1) a hot zone structure, (2) a crystal pulling length X at any portion (a pulling length after the OSF ring has a predetermined diameter) and (3) a distance in a direction of the crystal diameter from the center of the crystal at any part.

We can know the rotation of OSF ring diameters and average pulling rate in each pulling length by measurement of the OSF ring diameters of all crystal length, for several average pulling rate crystals. In view of the regression from the experimental values, a relation between the OSF ring diameter, the crystal pulling length and the average pulling rate can be measured.

Based on the relational expression obtained, the average pulling rate V required for generating the OSF ring at any position in a predetermined portion in the crystal pulling direction can be determined. Specifically, when the crystal is pulled, the average pulling rate pattern is previously determined according to the crystal pulling length, and the crystal is pulled up according to the average pulling rate pattern. Thus, the crystal having the OSF ring positioned at a target position can be obtained.

The invention described in claim 2 relates to a method of manufacturing a silicon single crystal to be grown by the Czochralski method according to claim 1, wherein in comprising; using a prediction formula, based on previous crystals pulling data, to predict the average pulling velocity pattern; measuring the actual value of the average pulling velocity, in view of the diameter of the OSF ring; calculating the prediction formula to compensate for the next crystal grown.

The CZ furnace comprises a carbon heater, a heat insulating material, a carbon crucible and other members. These members are continuously used for tens to hundreds of pulling times. And, these members are degraded and worn with time due to their reaction with vapor or drops of a silicon melt, reaction with gas produced from the silicon melt and carbon, reaction with the quartz crucible, and a thermal characteristic in the hot zone of the CZ furnace is also changed with time.

Therefore, it is presumed that the OFS ring diameter deviates from the initial set value as the number of pulling times increases.

According to the invention, the change of the OSF ring diameter is examined, a prediction formula of the average pulling rate pattern is corrected by the results of the previous batch.

Therefore, even when the thermal characteristics of the hot zone structure in the furnace change with time, a crystal having the OSF ring positioned at the target position can be obtained according to the corrected pulling rate pattern.

The invention can use the result of the initial batch or one batch other than the initial batch to correct the prediction value of the average pulling rate.

When measuring the OSF ring position in order to correct the prediction value, it is not necessary to measure the OSF ring positions over the entire crystal, it is sufficient by measuring the OSF ring generation position at representative main positions of several crystals. Also, the measuring may be satisfactorily made by an inferring method such as an interpolation method and an extrapolation method.

The invention described in claim 3 relates to a single crystalline silicon wafer, which is formed of only an oxygen precipitation area and/or an oxygen precipitation suppressing area grown by the Czochralski method.

Thus, when the pulling rate is adjusted by the CZ method to grow silicon single crystal consisting of only the OSF ring, the oxygen precipitation area and/or the oxygen precipitation suppressing area, a silicon single crystal having stable quality can be obtained by pulling the crystal so that the OSF ring area is formed at the center of the crystal, and predetermined areas are formed on the outside of the OSF ring area in the crystal. In other words, the outer diameter area of the OSF ring area is an index for crystal quality.

A silicon wafer obtained from this single crystal is a high-quality silicon single crystal free from the formation of grown-in defects.

The invention described in claim 4 relates to a single crystalline silicon wafer, which is characterized in that a single crystalline silicon wafer, which is formed of only an oxygen precipitation area and/or an oxygen precipitation suppressing area grown by a Czochralski method, undergoes an oxygen out diffusion treatment.

When the single crystalline silicon wafer is formed from this single crystal and subjected to the oxygen out diffusion treatment, supersaturated oxygen present on the wafer surface layer is out diffused, and a high-quality single crystalline silicon wafer, which does not have oxygen precipitates or any secondary defects induced thereby on the wafer surface layer serving as the device active region, can be formed.

The invention described in claim 5 relates to a single crystalline silicon wafer, which is characterized in that a single crystalline silicon wafer, which is formed of only an oxygen precipitation area and/or an oxygen precipitation suppressing area grown by a Czochralski method, undergoes an oxygen out diffusion treatment and further an oxygen precipitation nucleus forming treatment.

The single crystalline silicon wafer formed of the crystal consisting of only the OSF ring area, the oxygen precipitation area and/or the oxygen precipitation suppressing area grown by the Czochralski method becomes a high-quality silicon wafer free from grown-in defects. When this silicon wafer is subjected to the oxygen precipitation dispersing treatment, the wafer surface layer to be the device active region is formed as a denuded zone (DZ), free from defects such as oxygen precipitates. Besides, when the silicon wafer is subjected to the oxygen precipitation nucleus forming treatment, a high-quality single crystalline silicon wafer, which has an IG layer having an intrinsic gettering effect formed in the wafer, is formed.

BEST MODE FOR CARRYING OUT THE INVENTION

The present invention will be described in detail with reference to the drawings.

Embodiment 1

A high-purity polycrystalline silicon raw material of 45 kg was placed in a quartz crucible having a diameter of 18 inches, doped with boron, and the polycrystalline silicon is heated to melt. Then, a single crystal of a diameter of 155 mm and a crystal orientation (100) was pulled up at each of the average pulling rate of 0.35, 0.37, 0.4, 0.45, 0.55, 0.7 and 0.85 mm/minute to grow a plurality of crystals at the respective average pulling rate. The respective grown crystals were cut in the crystal growing direction to prepare evaluation samples. Each sample was heated in an oxygen atmosphere at 800° C. for 4 hours and 1000° C. for 16 hours, and a distribution of crystal defects (OSF) of each sample was evaluated by X-ray topography. Then an outer diameter of the OSF ring was determined as an OSF ring diameter.

Figure 1:
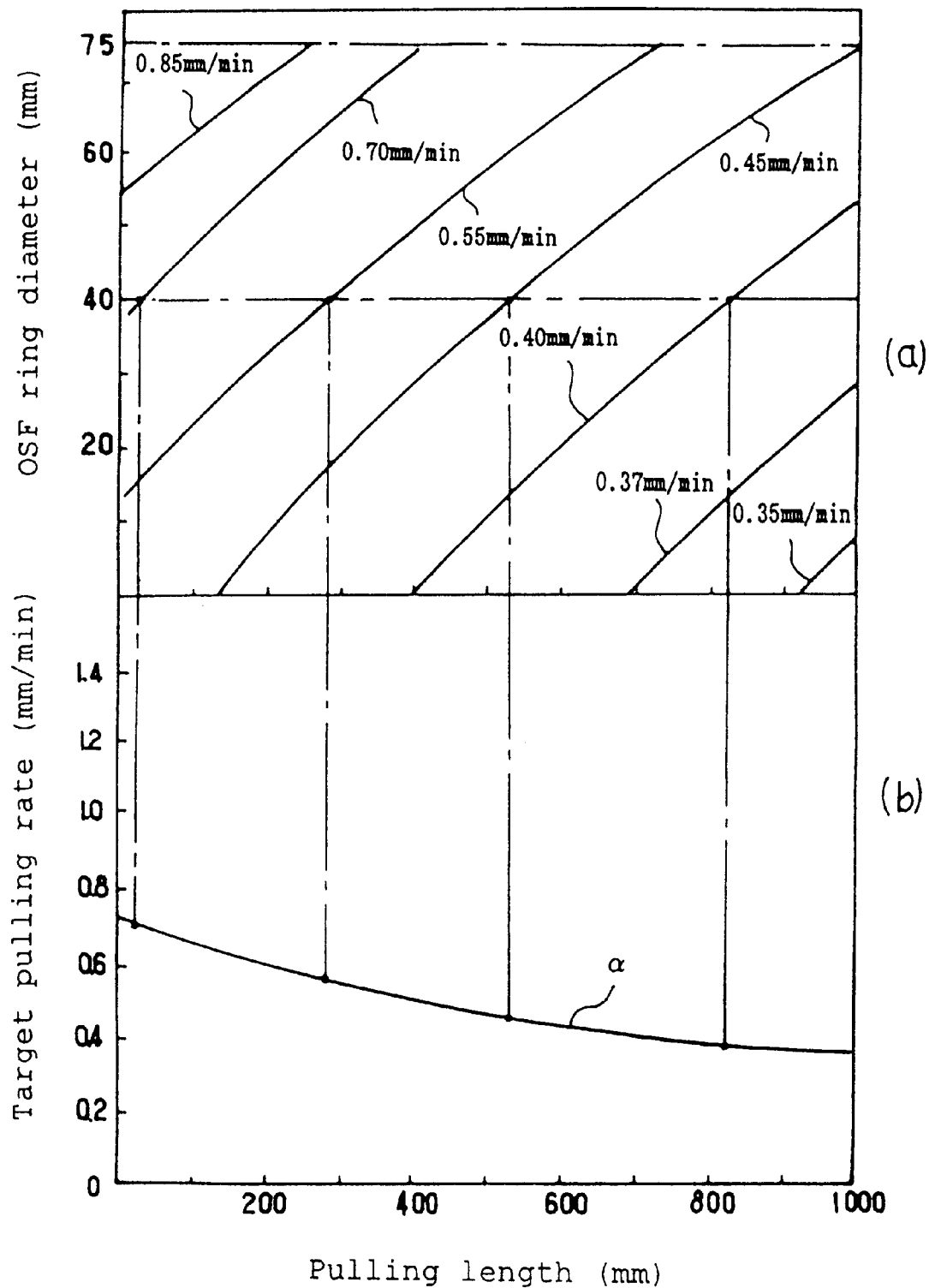
FIG. 1 is a diagram showing the evaluated results in an Embodiment 1 as an example of the present invention, wherein FIG. 1(*a*) shows a relation between a pulling length at a pulling rate of each crystal and an OSF ring diameter position, and FIG. 1(*b*) shows a target pulling rate plotted from FIG. 1(*a*) so to have a desired OSF ring diameter in a pulling length of each crystal.

FIG. 1 shows the evaluated results in this embodiment, in which FIG. 1(a) shows a relation between a pulling length of each single crystal grown at each average pulling rate and an OSF ring diameter.

FIG. 1(b) is a diagram showing a target pulling rate plotted from FIG. 1(a) so as to have a desired OSF ring diameter with the pulling length of each crystal.

As shown in FIG. 1(b), a pulling length for providing a predetermined OSF ring diameter is read from FIG. 1(a), and an average pulling rate for growing a crystal having the pulling length read from FIG. 1(a) is plotted in FIG. 1(b). Thus, a target pulling rate required for fixing the OSF ring at any position can be determined at a predetermined position in a direction of the crystal pulling length.

An approximate curve connecting respective plots of the target pulling rate is determined as an average pulling rate pattern, and when the crystal is pulled up based on the average pulling rate pattern, a single crystal having the OSF ring positioned at a predetermined position over the whole crystal pulling length can be obtained.

For example, a case of determining an OSF ring diameter to 40 mm over the whole pulling length of the crystal will be described.

Specifically, a vertical line is drawn from a point of the OSF ring diameter of 40 mm in FIG. 1(a), and points where the vertical line intersects with respective average pulling rate curves are read, lines are vertically drawn downward from the respective points, and a pulling length so to have the OSF ring diameter of 40 mm in the crystal grown at each average pulling rate is measured.

Then, lines are vertically drawn from the pulling length read in FIG. 1(a) into FIG. 1(b), and average pulling rate for growing the crystal with the measured pulling length are plotted. The plotted points indicate the target pulling rate to determine the OSF ring diameter to 40 mm and when an approximate curve is drawn through the plotted points, an average pulling rate pattern α in growing the crystal to determine the OSF ring diameter to 40 mm is obtained.

When the crystal is pulled up based on the average pulling rate pattern α, the crystal can be obtained with the OSF ring diameter determined to 40 mm over the whole crystal pulling length.

Therefore, when the single crystal is pulled up based on the designed average pulling rate pattern, the single crystal with the OSF ring generated on or disappeared from a predetermined position can be obtained.

The single crystal with the OSF ring diameter determined can have a crystal defect controlled and can be made to have high quality.

Embodiment 2

A high purity polycrystalline silicon raw material of 45 kg was placed in a quartz crucible having a diameter of 18 inches, doped with boron, and the polysilicon was heated to melt. Then, a single crystal of a diameter of 155 mm and a crystal orientation (100) was pulled up. In this embodiment, the average pulling rate pattern of the following two conditions was designed based on the results measured in Embodiment 1. Also, the crystals in this embodiment were pulled up based on the average pulling rate pattern designed under the aforesaid two conditions to grow them.

Condition 1: The average pulling rate pattern was designed so that an OSF ring disappears from the crystal pulling length of 200 mm, and the crystal was grown to a pulling length of 750 mm.

Condition 2: The average pulling rate pattern was designed so that the OSF ring remains at the center of the crystal when the crystal pulling length was in a range of from 200 mm to 400 mm. Also, the pulling rate pattern with a limit that the OSF ring diameter disappears at the center when the crystal pulling length is in a range of from 400 mm to 750 mm was designed, and the crystal was grown to a pulling length of 750 mm.

The pulling rate pattern at the limit that the OSF ring diameter disappears at the center means an approximate curve which is obtained by determining the crystal pulling rate at a limit that the OSF ring diameter becomes 0 mm in a range of 400 mm to 750 mm of the crystal pulling length and plotting the obtained value at each point of the crystal.

The crystal was pulled up based on the average pulling rate pattern designed according to the aforesaid conditions 1 and 2.

Each grown crystal was cut in a direction that the crystal was grown to prepare an evaluation sample. Each sample was thermally treated in an oxygen atmosphere at 800° C. for 4 hours and 1000° C. for 16 hours and evaluated for the distribution of a crystal defect (OSF) by X-ray topography.

Figure 2:
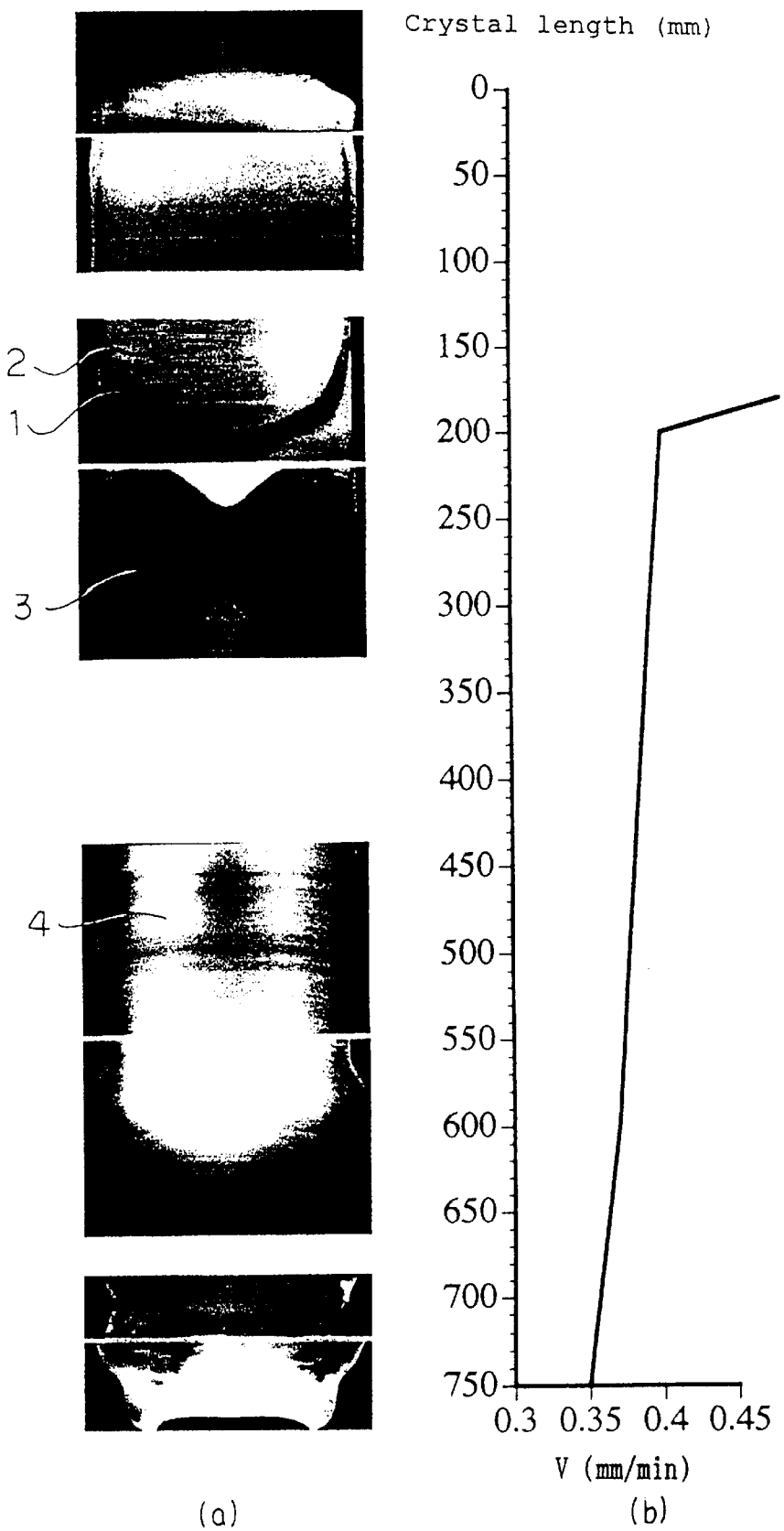
FIG. 2 is a diagram showing an embodiment of the invention, wherein FIG. 2(*a*) shows distribution of crystal defects of a sample formed by cutting in a direction of a pulling length of a crystal grown based on a pulling rate pattern designed under a condition 1 of an Embodiment 2, and FIG. 2(*b*) shows a relation between a crystal pulling length (mm) and an average pulling rate V (mm/min)
Figure 3:
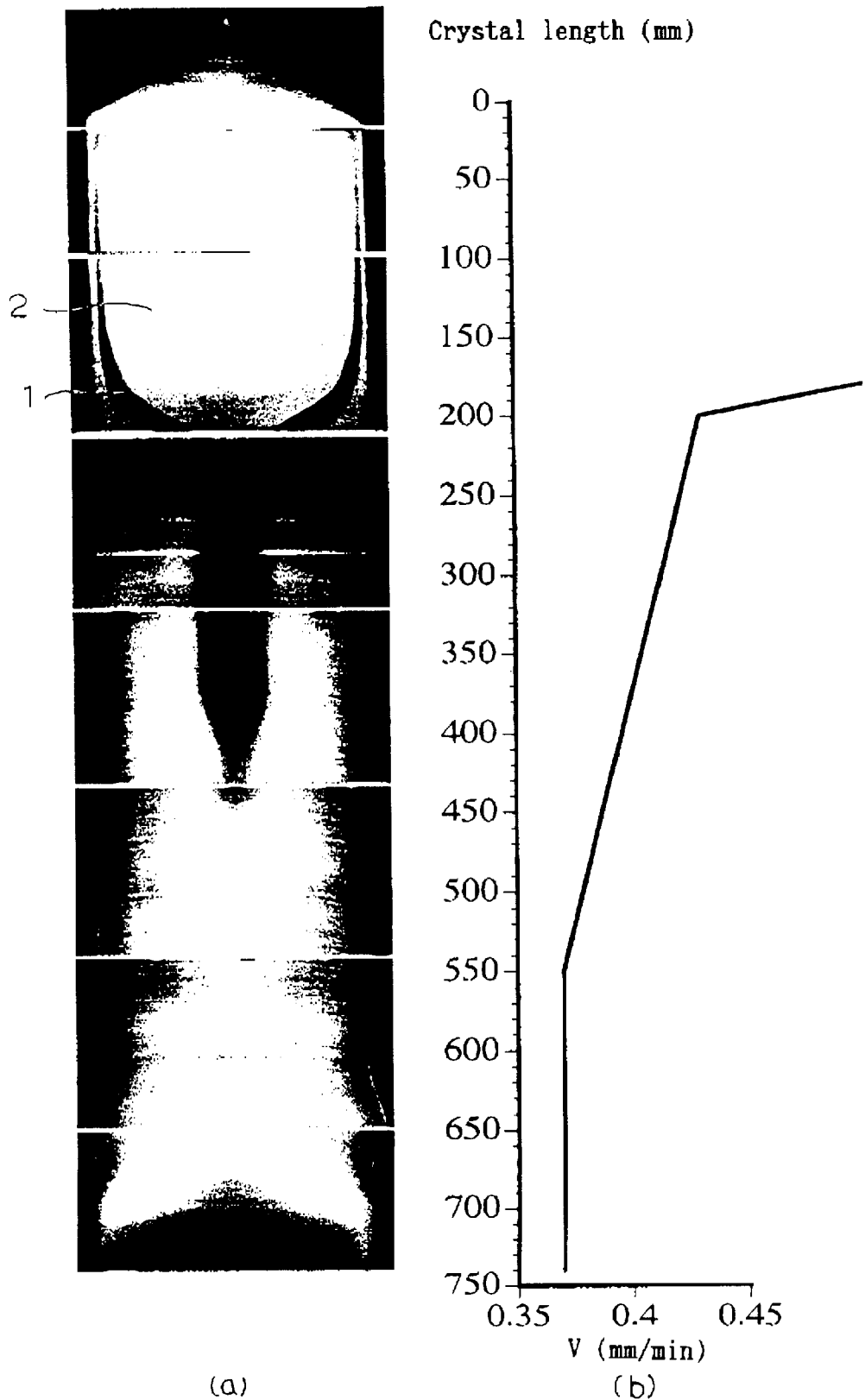
FIG. 3 is a diagram according to an embodiment of the invention, wherein FIG. 3(*a*) shows distribution of crystal defects of a sample formed by cutting in a direction of a pulling length of a crystal grown based on a pulling rate pattern designed under a condition 2 of the Embodiment 2, and FIG. 3(*b*) shows a relation between a crystal pulling length (mm) and an average pulling rate V (mm/min)

Results are shown in FIG. 2 and FIG. 3.

FIG. 2(a) is a diagram showing a distribution of crystal defects in the crystal sample grown according to the average pulling rate pattern designed under condition 1, and FIG. 2(b) is a diagram showing a relation between the aforesaid crystal pulling length (mm) and pulling rate V (mm/min).

FIG. 3(a) is a diagram showing a distribution of crystal defects in the crystal sample grown according to the average pulling rate pattern designed under condition 2, and FIG. 3(b) is a diagram showing a relation between a crystal pulling length (mm) and a pulling rate V (mm/min).

Specifically, FIG. 2(a) and FIG. 3(a) show a distribution of defects in the crystal pulled up according to the pulling rate patterns shown in FIG. 2(b) and FIG. 3(b).

In FIG. 2(a) and FIG. 3(a), 1 is an OSF ring area and 2 is a grown-in defect (COP) area. In FIG. 2(a) 3 is an oxygen precipitation suppressing area, and 4 is an oxygen precipitation area.

As shown in FIG. 2 (a), when a crystal was grown according to the average pulling rate pattern satisfying the condition 1 shown in FIG. 2(b), it was confirmed that the OSF ring disappeared at a target position, namely at the crystal pulling length of 200 mm.

As shown in FIG. 3(a), when a crystal was grown according to the average pulling rate pattern satisfying the condition 2 shown in FIG. 3(b), it was confirmed that the OSF ring remained or disappeared at a target position, namely remained at the center of the crystal in the crystal pulling length of 200 mm to 400 mm, and disappeared at the crystal pulling length of 400 mm or after, namely the OSF ring diameter was zero.

Also, the crystals pulled up according to the aforesaid conditions 1 and 2 were cut in a direction of the crystal diameter and processed by a predetermined method to prepare samples, and defects in the respective crystals were evaluated by the following methods.

1. Evaluation of defects by OPP (Optical Precipitate Profiler).
2. Evaluation of defects through an optical microscope after immersing in Secco etchant.
3. Evaluation of defects by X-ray topography after Cu decoration.
4. Evaluation of defects by a particle counter after repetitive cleaning with SC-1 cleaning solution.

The aforesaid samples were observed for the grown-in defects by the aforesaid evaluation methods. But, no grown-in defects were found in all the samples by any of the evaluation methods.

In FIG. 2(a), a diagram showing a defective portion is missing from 330 mm to 430 mm of the pulling length because the sample was prepared by cutting the crystal at the pertinent portion in a direction of the crystal diameter.

Embodiment 3

When the crystal is pulled up once, the average pulling rate is changed several times in order to grow the crystal, the OSF ring diameters formed at respective crystal lengths are measured along the entire crystal. Also, the average rate pattern is designed from a relation among the OSF ring diameter, the crystal pulling length and the average pulling rate. This method will be described specifically.

In the same way as in Embodiment 1, a high-purity polycrystalline silicon raw material of 45 kg was placed in a quartz crucible having a diameter of 18 inches, doped with boron, and the polycrystalline silicon was heated to melt. Then a single crystal which was to have a diameter of 155 mm and a crystal orientation (100) was pulled up.

The crystal was pulled up at pulling rate to be described hereinafter.

Specifically, the average pulling rate was linearly changed in a range of 0.2 mm/minute to 1.5 mm/minute between 0 mm and 100 mm of the crystal pulling lengths and also linearly changed in a range of 1.5 mm/minute to 0.2 mm/minute between 100 mm and 200 mm of the crystal pulling lengths. The average pulling rate was also changed at every 100 mm of the pulling length to grow the crystal to the pulling length of 600 mm.

As described above, the crystal grown with the average pulling rate which had changed a plurality of times was cut in a direction that the crystal was grown to prepare an evaluation sample. This sample was thermally treated in an oxygen atmosphere at 800° C. for 4 hours and 1000° C. for 16 hours, and the sample was evaluated for a distribution of crystal defects (OSF) by X-ray topography. Then the outer diameter of the OSF ring was determined as the OSF ring diameter.

Figure 4:
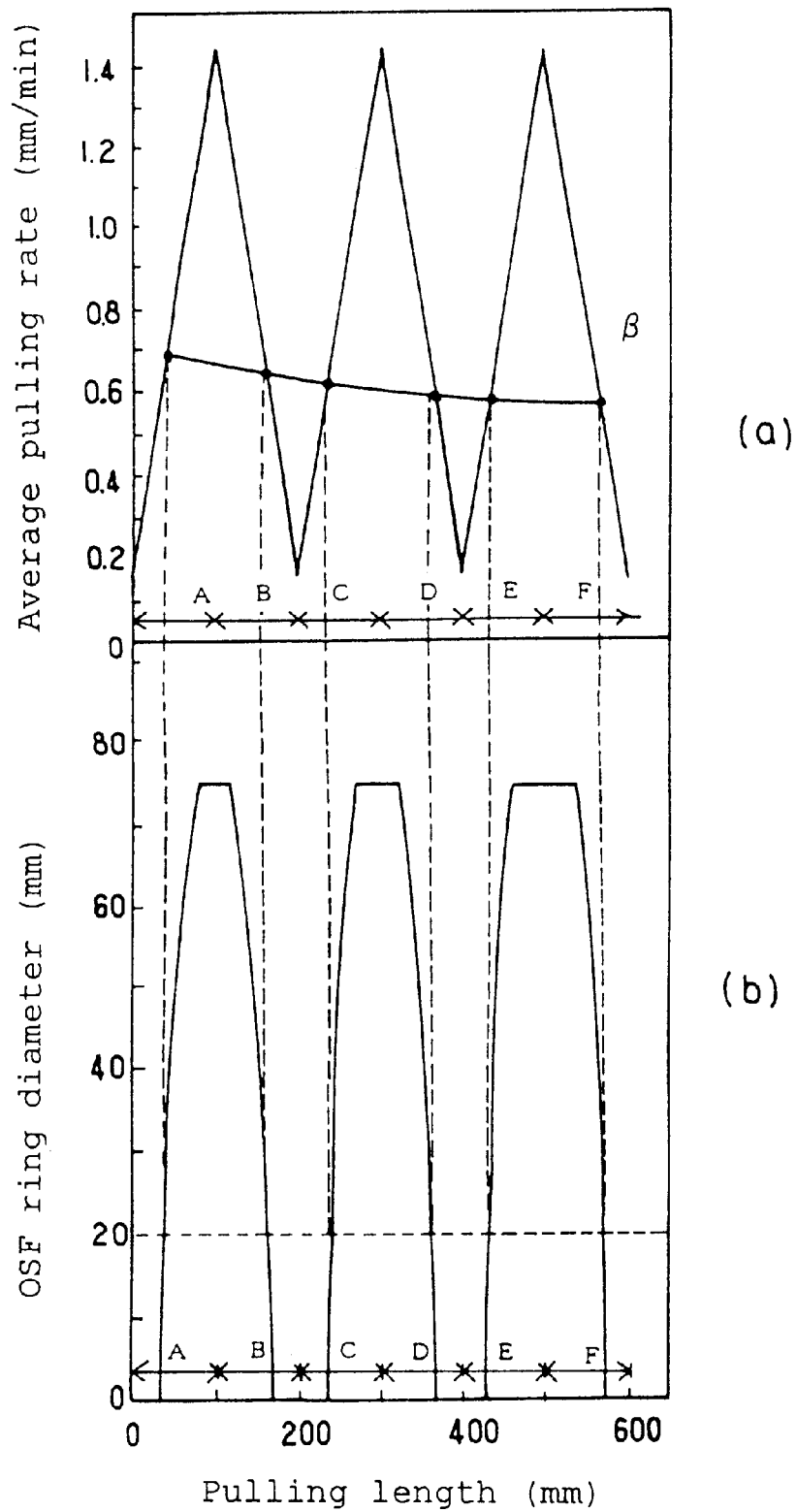
FIG. 4 is a diagram according to an embodiment of the invention, wherein FIG. 4 (*a*) shows a relation between a pulling length and an average pulling rate for every crystal pulling length of 100 mm, and FIG. 4(*b*) shows a relation between a pulling length and an OSF ring diameter for every crystal pulling length of 100 mm.

FIG. 4 shows the results of evaluation in this embodiment. FIG. 4(a) is a diagram showing a relation between the pulling length and the average pulling rate of the single crystal in this embodiment. FIG. 4(b) is a diagram showing a relation between the pulling length and the OSF ring diameter of the single crystal in this embodiment.

Now, a method of designing the average pulling rate pattern to form the OSF ring at a target position in view of FIG. 4(a) and FIG. 4(b) will be described.

First, the crystal pulling length in order to have the predetermined OSF ring diameter was read for respective zones (A, B, C, D, E, F) at a unit of 100 mm in a range of the pulling length of 0 mm to 600 mm.

Specifically, in order to have the OSF ring diameter at a position of 20 mm, a point to have the OSF ring diameter of 20 mm is sought in the zone A of FIG. 4(b), a vertical line is drawn from the found point, and the pulling rate V (mm/min.) at a point intersecting with the vertical line in FIG. 4(a) is read.

Similarly, for the zones B, C, D, E, F of FIG. 4(b), points to have the OSF ring diameter of 20 mm are sought, vertical lines are drawn from the found points, and the pulling rate (mm/min.) at points intersecting with the vertical lines are read. Therefore, the average pulling rate value can be obtained for each of the zones A, B, C, D, E, F of FIG. 4(b), and the average pulling rate of a total of six points are plotted. By drawing an approximate curve through the six plotted points, an average pulling rate pattern β which can determine the OSF ring diameter to 20 mm over the entire crystal pulling length can be obtained.

By pulling up the single crystal based on the average pulling rate pattern β, the single crystal with the OSF ring diameter determined to 20 mm over the entire crystal length can be obtained.

Thus, when the target pulling rate pattern is determined, and the crystal is pulled up based on this pattern, the OSF ring diameter can be determined at a desired position, so that a single crystal of high quality can be produced by controlling a crystal defect affected by the position where the OSF ring is generated.

Embodiment 4

The position where the OSF ring is generated is variable with degradation of the hot zone in the furnace. Therefore, when a crystal is pulled up according to the average pulling rate pattern designed before the furnace is degraded, it is possible that the crystal without the OSF ring diameter determined at the desired position might be grown. Therefore, it is necessary to correct the average pulling rate pattern to pull the crystal.

Now, a method of correcting the average pulling rate pattern will be described.

First, the average pulling rate in order to have the OSF ring diameter of 30 mm in the vicinity of the pulling length of 350 cm was measured at every pulling batch times of zero, 10 and 20 times.

Figure 5:
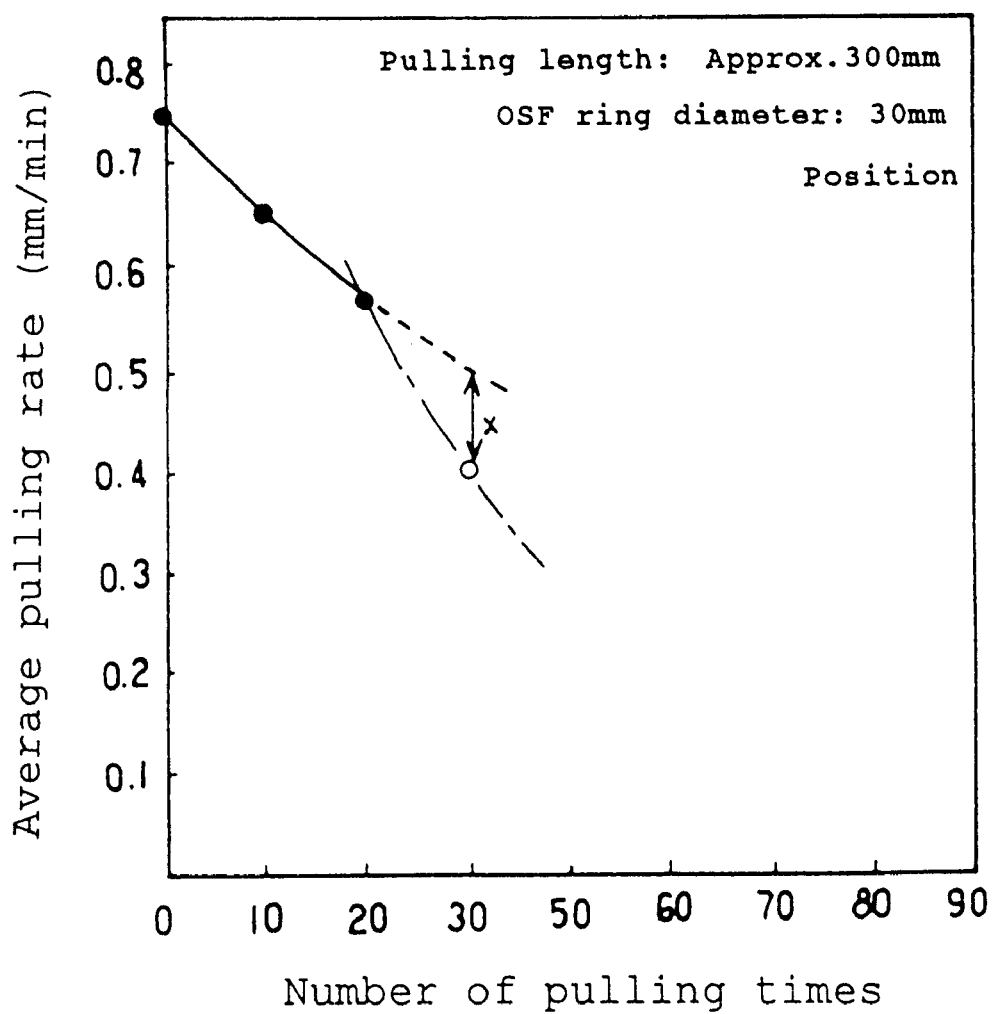
FIG. 5 is a diagram according to an embodiment of the invention, showing a relation between a number of times of pulling batch and an average pulling rate to have an OSF ring diameter of 30 mm in the vicinity of a pulling length of 300 mm for every number of pulling batch times.

FIG. 5 is a diagram showing a relation between a crystal pulling batch and an average pulling rate of a crystal in order to have the OSF ring diameter of 30 mm at the crystal pulling length of about 300 mm.

As shown in FIG. 5, the 21st pulling batch allows to predict the average pulling rate value from an approximate curve (the broken line in FIG. 5) prepared by plotting the average pulling rate at the 0th pulling batch, the 10th pulling batch and the 20th pulling batch.

Therefore, an approximate curve connecting the plotted points of the average pulling rate by measuring the average pulling rate at the numbers of pulling batch times such as the 0th, 10th and 20th pulling batches can be determined as the average pulling rate pattern to pull up a crystal with the OSF ring diameter determined at a desired position.

But, when the average pulling rate of a crystal having the OSF ring diameter of 30 mm at the crystal pulling length of about 300 mm is measured at the 30th pulling batch, the result may be as indicated by a mark ○ in FIG. 5 due to degradation or the like of the furnace. In this case, there is an error X between the aforesaid predicted value and the actual measured value.

To correct the average pulling rate error X, the average pulling rate at the 20th batch and the average pulling rate at the 30th batch are plotted to form a correction curve (a dash and dotted line in FIG. 5), and the average pulling rate for the 31st and subsequent batches can be corrected.

Thus, by using the most approximate measured value, the later tendency is predicted, and the average pulling rate pattern can be corrected. When the average pulling rate pattern is corrected for every predetermined number of batch times, a crystal having the OSF ring determined at a predetermined position can be obtained in the same way as the crystal grown at the beginning of batch without being affected by the degradation of the furnace or the like.

According to the manufacturing method of this embodiment described above, a crystal with the OSF ring diameter determined at the predetermined position can be obtained by designing a predetermined average pulling rate pattern and pulling the crystal based on the average pulling rate pattern.

By correcting the designed average pulling rate pattern for every predetermined number of batch times, a crystal having the OSF ring diameter determined at a predetermined position can be grown without being affected by the degradation or the like of the furnace.

According to the manufacturing method of this embodiment, a crystal having the OSF ring determined at the predetermined position canbe obtained, and even in the silicon single crystal with its quality being affected by a position of generation of the OSF ring diameter, a silicon single crystal having the target quality can be produced.

Now, a silicon wafer formed from the silicon single crystal produced by the aforesaid method will be described.

Embodiment 5

As shown in FIG. 2, a silicon wafer formed of the grown-in defect (COP) area 2 on the inside of the OSF ring, the oxygen precipitation suppressing area 3 and the oxygen precipitation area 4 both present on the outside of the OSF ring in the silicon single crystal grown under the aforesaid condition 1 was used as a sample to evaluate its oxygen precipitation behavior.

For comparison with the wafer samples prepared from the aforesaid three areas in the formed silicon single crystal, a silicon wafer prepared from a dislocation cluster area present on the outside of the OSF ring and also outside of the oxygen precipitation suppressing area 3 and the oxygen precipitation area 4 in the silicon single crystal was evaluated at the same time. The wafer prepared from the dislocation cluster area has the dislocation cluster on its entire surface.

The wafers formed of the oxygen precipitation suppressing area 3 and the oxygen precipitation area 4 are high-quality crystals free from a grown-in defect (COP, dislocation cluster).

First, silicon wafers were prepared by horizontally cutting the crystal at the grown-in defect (COP) area 2, the oxygen precipitation suppressing area 3 and the oxygen precipitation area 4 (see FIG. 2).

The silicon wafers prepared from the respective areas of the single crystal were thermally treated in a dry oxygen atmosphere respectively at 700° C. for 4 hours and 1000° C. for 16 hours, at 800° C. for 4 hours and 1000° C. for 16 hours, at 900° C. for 4 hours and 1000° C. for 16 hours, at 1000° C. for 16 hours, and at 1100° C. for 16 hours to prepare five types of samples.

Then, an oxidation film was removed from the aforesaid silicon wafers with a liquid of $HF:H_2O=1:1$, and its surface layer of 2 $\mu$m was etched with Wright etchant. The Wright etchant had a mixing ratio of $HF:HNO_3:CrO_3:Cu(NO_3)_2:H_2O:CH_3COOH=60:30:30:2:60:60$.

Then, each silicon wafer sample undergone the aforesaid treatment was measured for an oxygen precipitate density using an optical microscope.

Figure 6:
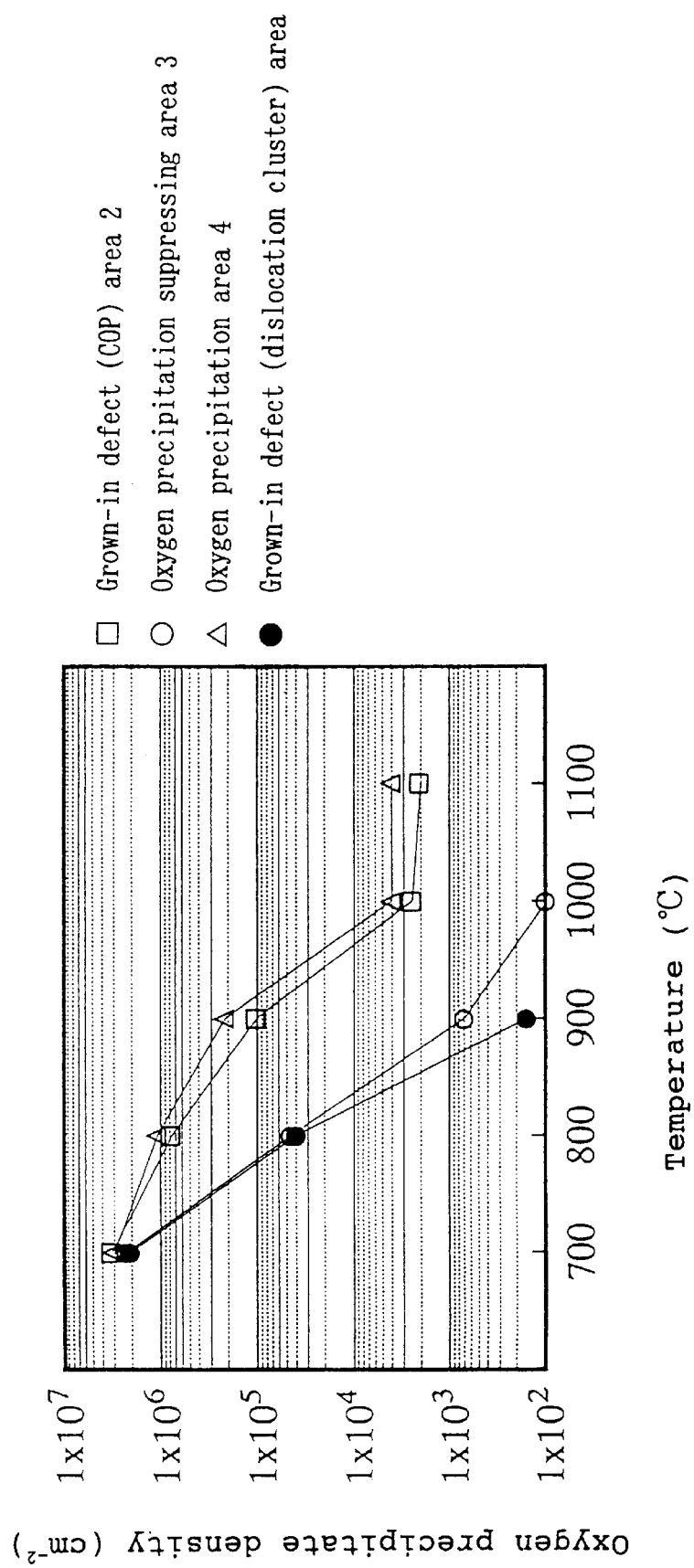
FIG. 6 is a diagram according to an embodiment of the invention, showing a relation between a heat treating temperature of a single crystalline silicon wafer, which consists of a grown-in defect (COP) area, an oxygen precipitation suppressing area, an oxygen precipitation area and a grown-in defect (dislocation cluster) area, and a density of oxygen precipitates present in the single crystalline silicon wafer after heat temperature.

FIG. 6 shows the results of the evaluation of the silicon wafers prepared from the respective areas as a relation between the heat treating temperatures applied to the wafers and the oxygen precipitate densities appearing on the wafers undergone the heat treatment at the aforesaid temperatures. In the drawing, a mark □ indicates the evaluated results of the wafer prepared from the grown-in defect area 2, a mark ○ indicates the evaluated results of the wafer prepared from the oxygen precipitation suppressing area 3, a mark Δ indicates the evaluated results of the wafer prepared from the oxygen precipitation area 4, and a mark ● indicates the evaluated results of the comparison sample prepared from the grown-in defect (dislocation cluster) area.

The grown-in defect area 2 shown in FIG. 2 is generally used as a semiconductor wafer.

As shown in FIG. 6, the oxygen precipitate density of the wafer formed from the grown-in defect area 2 and the oxygen precipitate density of the wafer formed from the oxygen precipitation area 4 can be found to have substantially the same value at the respective heat treating temperatures.

On the other hand, the oxygen precipitate density of the wafer formed from the oxygen precipitation suppressing area 3 was found to have substantially the same value with the oxygen precipitate density of the wafer formed as the comparison sample from the grown-in defect (dislocation cluster) area at the respective heat treating temperatures.

It was confirmed from these results that when the oxygen precipitation suppressing area 3 and the oxygen precipitation area 4 of high quality without a grown-in defect in the single crystal were used, the oxygen precipitation behavior in each wafer was the same as the wafer formed from the area having grown-in defects (dislocation cluster, COP).

It was confirmed from such results that when the wafers prepared from the oxygen precipitation suppressing area 3 and the oxygen precipitation area 4 undergone the oxygen out diffusion treatment, the oxygen precipitating treatment and the like, anon-defective area free from defects such as oxygen precipitate in the device forming region on the surface layer of the wafer could be formed, and a high-quality wafer formed of an absorption layer for the absorption and the removal of contaminants from the device active region could be prepared.

According to Embodiments 1, 3 and 4, the OSF ring diameter can be determined at any position in the silicon single crystal, and the entire silicon single crystal can be formed in the oxygen precipitation suppressing area 3 and the oxygen precipitation area 4.

Embodiment 6

By using the single crystal prepared by the aforesaid method, a silicon wafer was prepared from the grown-in defect area 2, the oxygen precipitation suppressing area 3 and the oxygen precipitation area 4 in the crystal (see FIG. 2) Then the silicon wafers prepared from the respective areas were subjected to the DZ-IG treatment to examine whether a desired DZ width could be formed and whether a desired IG layer could be formed.

First, a wafer prepared from any of the grown-in defect area 2, the oxygen precipitation suppressing area 3 and the oxygen precipitation area 4 shown in FIG. 2 was subjected to oxygen out diffusion treatment at 1150° C. for 3.5 hours, then an extraction nucleus formation treatment at 500° C. to 900° C. for four to six hours, and a heating treatment at 1000° C. for 16 hours. Then, the wafer was cleaved, the cleavage plane was etched to 2 $\mu$m with the Wright etchant, and a relation between the oxygen precipitate density and the DZ width was evaluated using an optical microscope.

Figure 7:
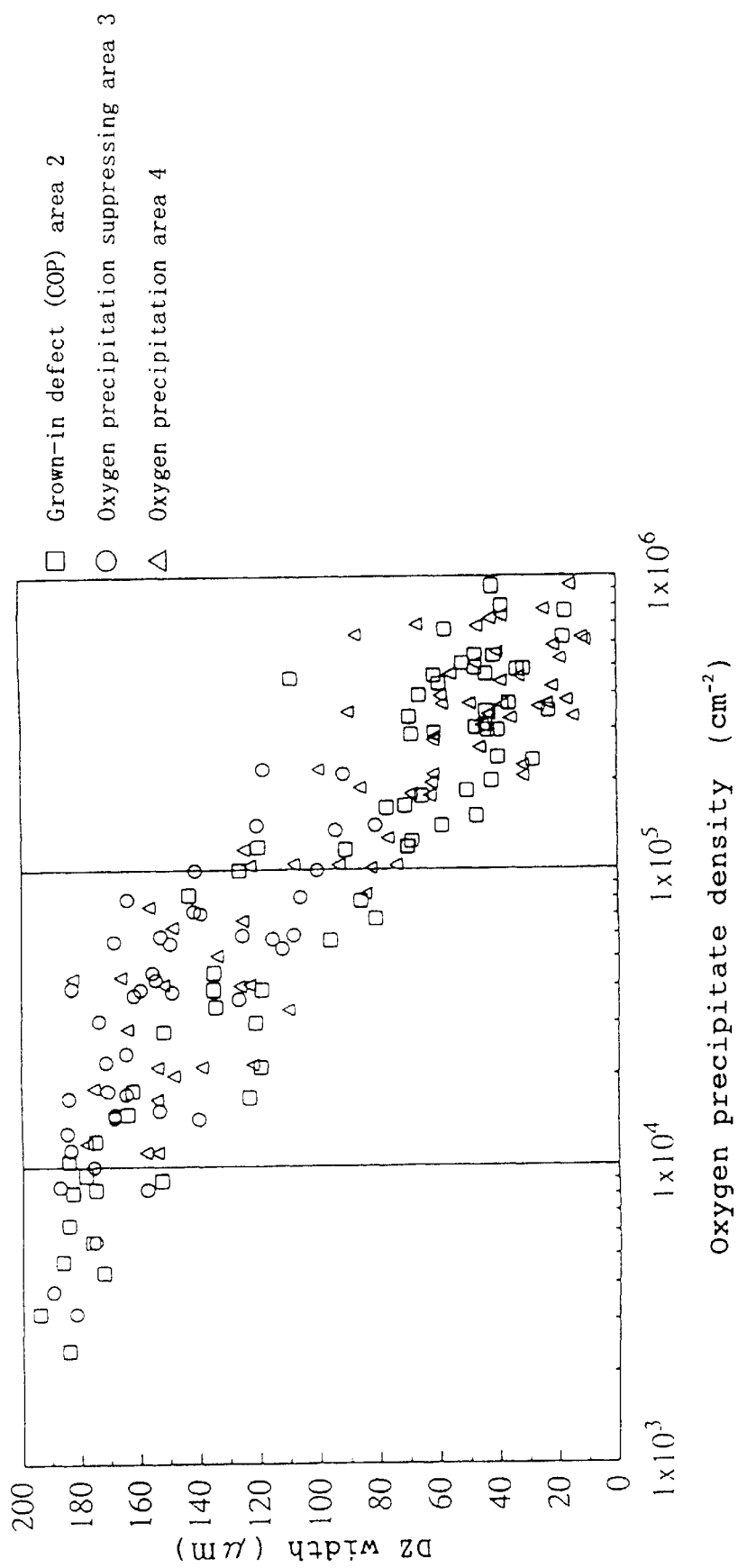
FIG. 7 is a diagram according to an embodiment of the invention, showing a relation between a density of oxygen precipitates present in a single crystalline silicon wafer, which consists of a grown-in defect (COP) area, an oxygen precipitation suppressing area and an oxygen precipitation area, and a width of DZ formed in the single crystalline silicon wafer.

FIG. 7 is a diagram showing a relation between the oxygen precipitate density of the wafers prepared from the respective areas and the DZ width formed. In the drawing, a mark □ indicates the evaluated results of the wafer prepared from the grown-in defect (COP) area 2, a mark ○ indicates the evaluated results of the wafer prepared from the oxygen precipitation suppressing area 3, a mark Δ indicates the evaluated results of the wafer prepared from the oxygen precipitation area 4.

As shown in FIG. 7, the oxygen precipitate density in the wafers prepared from each area by giving each treatment was confirmed to fall in a range of $1\times10^3$ $Cm^{-2}$ to $1\times10^6$ $cm^{-2}$. It was also confirmed that the DZ width of 10 μm or more can be obtained with the oxygen precipitate density in a range of $1\times10^3$ $cm^{-2}$ to $1\times10^6$ $cm^{-2}$.

Thus, it was found that when the wafer prepared from the grown-in defect area 2, the wafers prepared from the oxygen precipitation suppressing area 3 and the oxygen precipitation area 4 not having grown-in defects, were subjected to the DZ-IG treatment, the wafer prepared from each area of the crystal pulled according to the manufacturing method of this embodiment could have the same oxygen precipitate density and DZ width as the wafer prepared from the crystal pulled by the ordinary method.

Therefore, since the oxygen precipitation suppressing area 3 and the oxygen precipitation area 4 in the single crystal are free from grown-in defects, the wafers prepared from the oxygen precipitation suppressing area 3 and the oxygen precipitation area 4 could provide a high-quality single crystalline silicon wafer having the DZ-IG layer formed by applying the DZ-IG treatment.

Embodiment 7

Silicon wafers were prepared respectively from the grown-in defect area 2, the oxygen precipitation suppressing area 3 and the oxygen precipitation area 4 in the single crystal pulled up by the manufacturing method of this embodiment and evaluated for a gate oxide integrity voltage characteristic in each wafer. In this embodiment, an epitaxial wafer was subjected to the same treatment as that applied to the wafers prepared from the respective areas of the aforesaid single crystal and evaluated in the same way for comparison.

The respective wafers prepared from the grown-in defect area 2, the oxygen precipitation suppressing area 3 and the oxygen precipitation area 4 and the epitaxial wafer were thermally treated in a dry oxygen atmosphere at 950° C. for 34 minutes to form a gate oxide film of 25 nm in thickness on the respective wafer surfaces. Then, a polysilicon (poly-Si) film having a thickness of 400 nm was deposited on the respective wafer surfaces by a low pressure chemical vapor deposition (LPCVD), and phosphorus (P) was doped in the poly-Si film in a phosphorus chloride ($POCl_3$) atmosphere. Then, the respective wafers were subjected to resist coating, masking, developing and etching treatments.

Furthermore, each wafer was formed with a gate electrode having an electrode area of 8 $mm^2$.

And, the respective wafers treated as described above were evaluated for the gate oxide integrity voltage characteristic by TZDB (time zero dielectric breakdown) method (judgment electric field of 11 MV/cm).

Apart from the above evaluation, the respective wafers were formed a gate electrode having an electrode area of 1 $mm^2$ and evaluated for the gate oxide integrity characteristic by a constant-current TDDB (time dependent dielectric breakdown) method (injection current density of 50 mA/$cm^2$).

Figure 8:
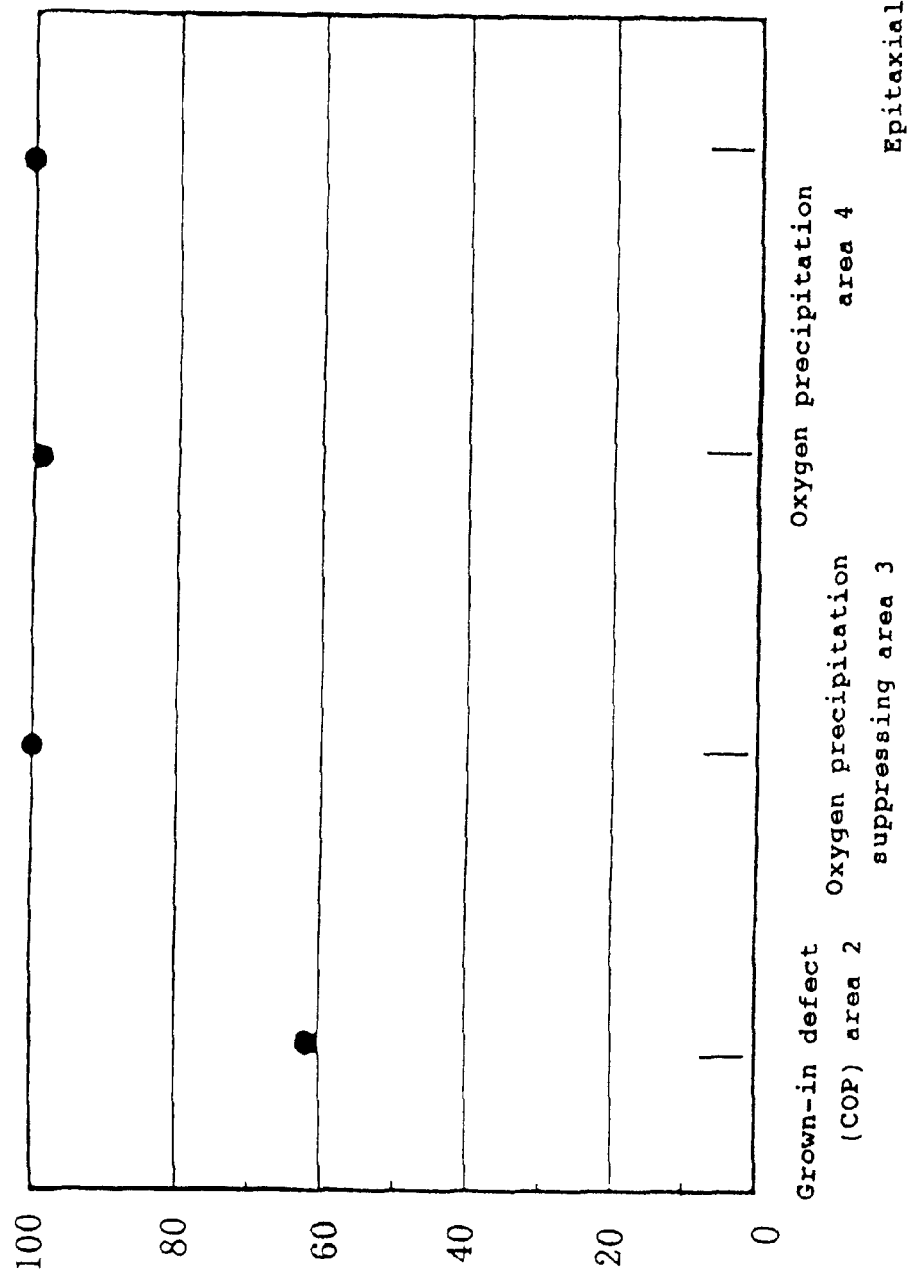
FIG. 8 is a diagram according to an embodiment of the invention, showing the evaluated results of a gate oxide integrity voltage characteristic, the evaluation performed by a TZDB method on a single crystalline silicon wafer consisting of any of a grown-in defect (COP) area, an oxygen precipitation suppressing area and an oxygen precipitation area, and an epitaxial wafer.

FIG. 8 shows the evaluated results of the gate oxide integrity voltage characteristic by the TZDB method.

As shown in FIG. 8, the wafer prepared from the grown-in defect area 2 has a low yield of 60% in view of the gate oxide integrity voltage characteristic, but the wafers prepared from the oxygen precipitation suppressing area 3 and the oxygen precipitation area 4 have a yield of 100% in the same manner as the epitaxial wafer evaluated for comparison. It was found that good yield of 100% can be obtained by the TZDB method.

Figure 9:
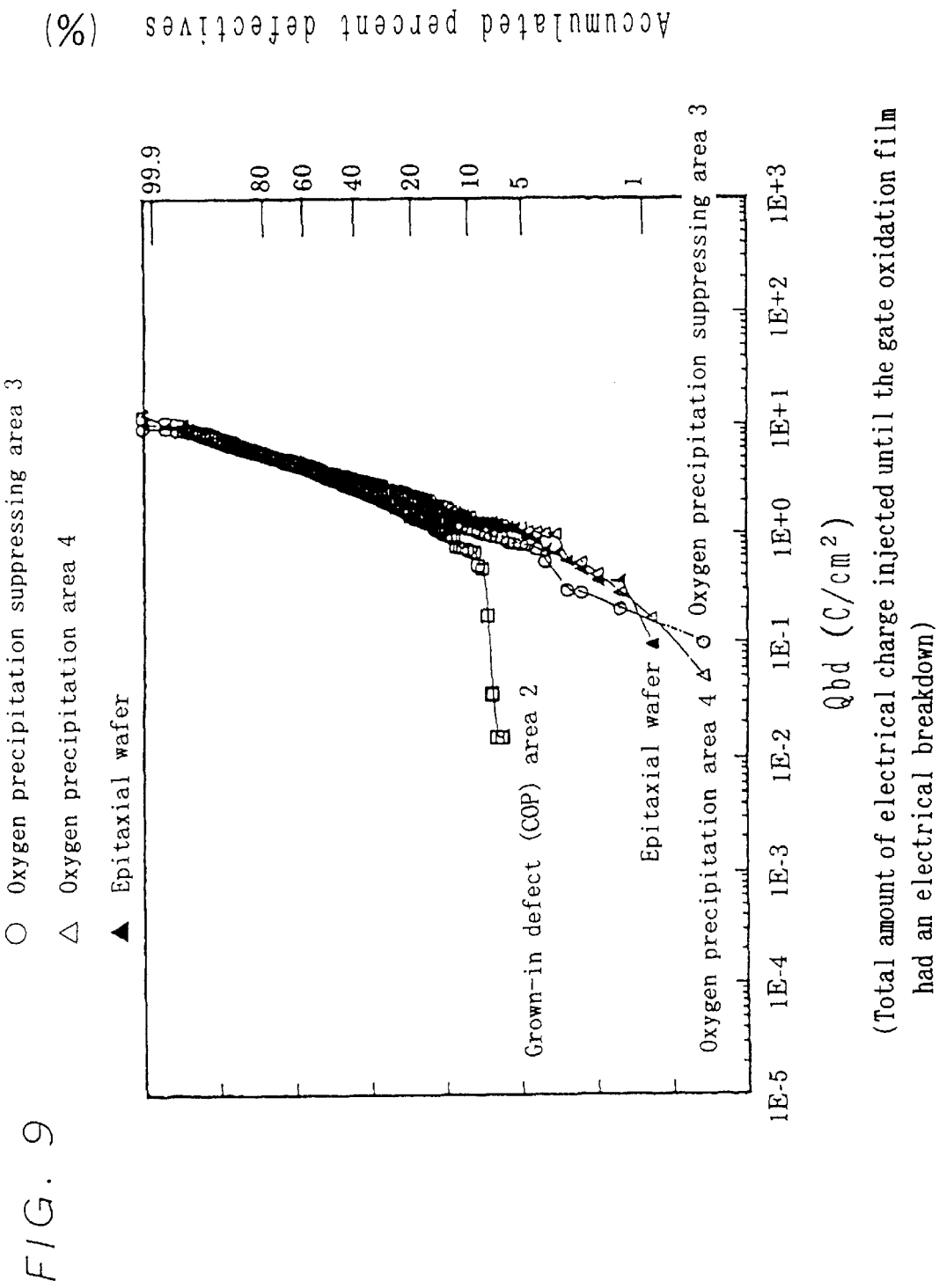
FIG. 9 is a diagram according to an embodiment of the invention, showing the evaluated results of a gate oxide integrity voltage characteristic, the evaluation performed by a TDDB method on a single crystalline silicon wafer consisting of a grown-in defect (COP) area, an oxygen precipitation suppressing area and an oxygen precipitation area, and an epitaxial water.

FIG. 9 shows the evaluated results of the oxidation film withstand voltage characteristic by the TDDB method.

As shown in FIG. 9, the wafer prepared from the grown-in defect area 2 has an initial defective percentage of 10% in view of the gate oxide integrity voltage characteristic, but the wafers prepared from the oxygen precipitation suppressing area 3 and the oxygen precipitation area 4 have an initial defective percentage of 1% or below in view of the gate oxide integrity voltage characteristic similar to that of the epitaxial wafer in view of the gate oxide integrity voltage characteristic.

As described above, according to the method of the present invention, a high-quality silicon single crystal having the oxygen precipitation suppressing area 3 and/or the oxygen precipitation area 4 free from a grown-in defect extended on the entire surface can be formed. When a silicon wafer is formed from the oxygen precipitation suppressing area 3 or the oxygen precipitation area 4 or from the oxygen precipitation suppressing area 3 and the oxygen precipitation area 4 and subjected to the DZ-IG treatment, a desired DZ free from a defect such as an oxygen precipitate is formed on the wafer surface layer. Also an IG layer for removing contaminants from the device active region is formed within the wafer, thus, a high-quality silicon wafer can be produced.

Figure 10:
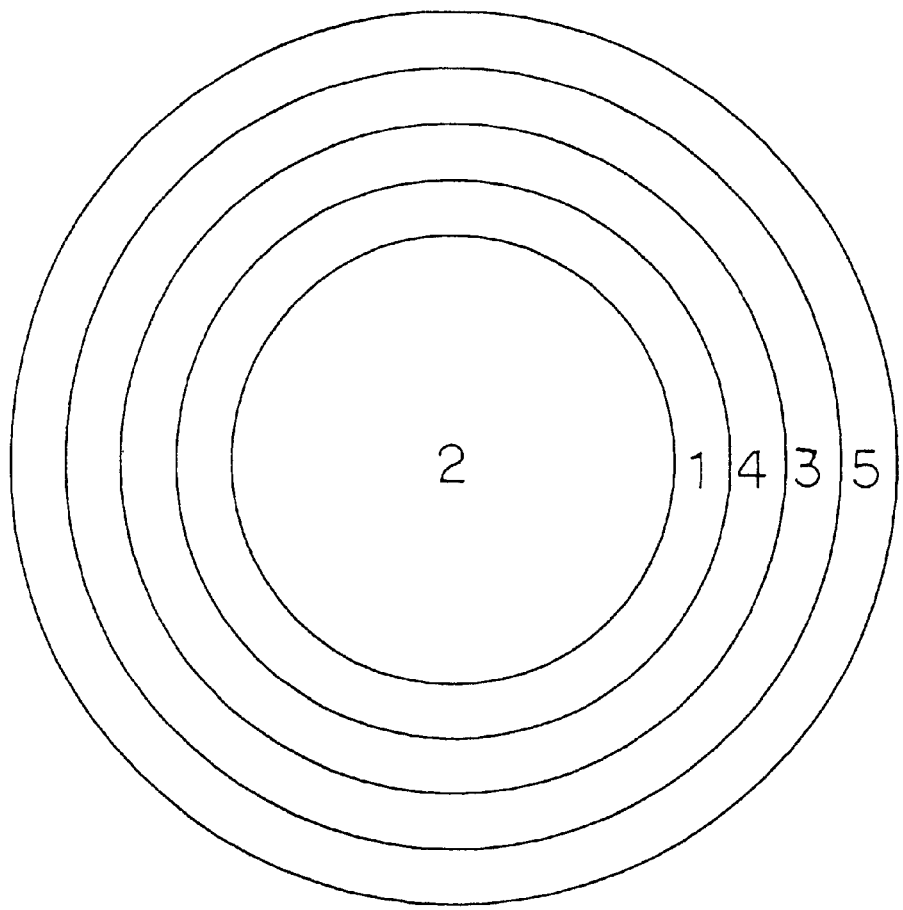
FIG. 10 is a diagram showing a positional relation among respective areas of a silicon single crystal.

Meanwhile, there are three zones outside the OSF ring. FIG. 10 shows the relative position of these areas in the pulled silicon single crystal; namely An oxygen precipitation are 4 is lust outside of OSF ring area 2, where oxygen readily precipitates.

And an oxygen precipitation suppressing area 3 is outside of the oxygen precipitation area 2, where oxygen hardly precipitates.

The OSF ring area, the oxygen precipitation area and the oxygen precipitation suppressing area are defect free area.

Next, a dislocation cluster 5 area exists outside the oxygen precipitation suppressing area. The dislocation cluster is a kind of grow-in defect which is a point defect originated from interstitial silicon and degrades a leak current characteristic of the device.

INDUSTRIAL APPLICABILITY

The present invention relates to a method of manufacturing a silicon single crystal to be used as a semiconductor device by the Czochralski method and a silicon wafer manufactured from the grown silicon single crystal. The method is suitable as a method of manufacturing a silicon single crystal with an OSF ring determined at a desired position by designing a predetermined pulling rate pattern from a relation between an OSF ring diameter and a crystal pulling rate at each crystal pulling length and the silicon wafer is suitable as a high-quality single crystalline silicon wafer.

What is claimed is:

1. A process for manufacturing a silicon single crystal wafer by a Czochralski method, comprising:

measuring a relation between a pulling length and a diameter of an OSF ring produced in a constant diameter body of the silicon single crystal wafer at more than two average pulling rates;

designing an average pulling rate pattern based on the measured relation to control the diameter of the OSF ring at a predetermined position; and pulling the silicon single crystal according to the designed average pulling rate pattern.

2. A process of claim 1, wherein the silicone crystal wafer comprises;

an oxygen precipitation area; and/or an oxygen precipitation suppressing area; and/or an OSF ring area.

3. A process of claim 1, wherein the wafer undergoes a high-temperature and long-time oxygen out diffusion treatment, and the wafer before the oxygen out diffusion treatment comprises;

an oxygen precipitation area; and/or an oxygen precipitation suppressing area; and/or an OSF ring area.

4. A process of claim 3, wherein the wafer further undergoes an oxygen precipitation nuclei forming treatment at 500 to 900 degrees centigrade.

5. A process for manufacturing a silicon single crystal wafer by a Czochralski method, comprising:

measuring a relation between a pulling length and a diameter of an OSF ring at more than two average pulling rates;

designing an average pulling rate pattern based on the measured relation to control the diameter of the OSF ring at a predetermined position; and pulling the silicon single crystal according to the designated average pulling rate pattern, wherein the process further comprises:

using a prediction formula, based on previous crystal pulling data, to predict the average pulling rate pattern:

measuring an actual value of the average pulling rate, in view of the diameter of the OSF ring; and calculating a difference from the predicted value of the average pulling rate, then readjusting the prediction formula to compensate for a next crystal to be grown.

* * * * *